(12) United States Patent
Kim et al.

(10) Patent No.: US 11,678,527 B2
(45) Date of Patent: Jun. 13, 2023

(54) DISPLAY DEVICE AND METHOD OF FABRICATING THE SAME

(71) Applicant: Samsung Display Co., LTD., Yongin-si (KR)

(72) Inventors: Young Dae Kim, Seoul (KR); Sang Jin Park, Yongin-si (KR); Min Jae Jeong, Yongin-si (KR); Min Kyung Kim, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 267 days.

(21) Appl. No.: 17/144,676

(22) Filed: Jan. 8, 2021

(65) Prior Publication Data

US 2021/0367015 A1 Nov. 25, 2021

(30) Foreign Application Priority Data

May 25, 2020 (KR) .................... 10-2020-0062357

(51) Int. Cl.
*H10K 59/123* (2023.01)
*H10K 50/86* (2023.01)
(Continued)

(52) U.S. Cl.
CPC ......... *H10K 59/123* (2023.02); *H10K 50/865* (2023.02); *H10K 59/122* (2023.02);
(Continued)

(58) Field of Classification Search
None
See application file for complete search history.

(56) References Cited

U.S. PATENT DOCUMENTS

2003/0146695 A1* 8/2003 Seki .................... H01L 51/5284
313/506
2009/0261712 A1* 10/2009 Choi .................. H01L 27/3246
257/E51.021

(Continued)

FOREIGN PATENT DOCUMENTS

KR 10-2005-0087284 8/2005
KR 10-2019-0108664 9/2019
(Continued)

*Primary Examiner* — Evren Seven
(74) *Attorney, Agent, or Firm* — Kile Park Reed & Houtteman PLLC

(57) ABSTRACT

A display device includes a planarization layer disposed on a substrate, a first electrode disposed on the planarization layer and including silver (Ag), a contact preventing layer disposed on the first electrode, including a light absorbing material, and including a top surface and a side surface extending from an end of the top surface, and a pixel defining layer disposed on the contact preventing layer and including a bottom surface facing the top surface of the contact preventing layer, and a side surface extending from an end of the bottom surface. The first electrode includes a first region overlapping pixel defining layer. The contact preventing layer includes a second region overlapping the first region between the first electrode and the pixel defining layer. A first edge where the top and side surfaces of the contact preventing layer meet is located on the bottom surface of the pixel defining layer.

13 Claims, 15 Drawing Sheets

(51) Int. Cl.
*H10K 59/38* (2023.01)
*H10K 59/40* (2023.01)
*H10K 59/122* (2023.01)
*H10K 71/00* (2023.01)
*H10K 71/20* (2023.01)
*G06F 3/041* (2006.01)
*H10K 59/12* (2023.01)

(52) U.S. Cl.
CPC ............ *H10K 59/38* (2023.02); *H10K 59/40* (2023.02); *H10K 71/00* (2023.02); *H10K 71/231* (2023.02); *H10K 71/233* (2023.02); *G06F 3/0412* (2013.01); *H10K 59/1201* (2023.02)

(56) References Cited

U.S. PATENT DOCUMENTS

2012/0168758 A1\* 7/2012 Jin ..................... H01L 27/3246
                                                      438/34
2020/0212148 A1\* 7/2020 Youn .................. H01L 27/3223

FOREIGN PATENT DOCUMENTS

| KR | 10-2038817 | 11/2019 |
| KR | 10-2084400 | 3/2020 |

\* cited by examiner

DISPLAY DEVICE AND METHOD OF FABRICATING THE SAME

CROSS-REFERENCE TO RELATED APPLICATION(S)

This application claims priority to and benefits of Korean Patent Application No. 10-2020-0062357 under 35 U.S.C. 119, filed in the Korean Intellectual Property Office on May 25, 2020, the entire contents of which are herein incorporated by reference.

BACKGROUND

1. Technical Field

The disclosure relates to a display device and a method of fabricating the same.

2. Description of the Related Art

With the advance of information-oriented society, more and more demands are placed on display devices for displaying images in various ways. For example, display devices may be employed in various electronic devices such as smartphones, digital cameras, laptop computers, navigation devices, and smart televisions. The display device may be a flat panel display device such as a liquid crystal display device, a field emission display device or an organic light emitting display device. Among the flat panel display devices, in the organic light emitting display device, since each pixel of a display panel may include a light emitting element capable of emitting light by itself, an image can be displayed without the need for a backlight unit providing light to the display panel.

The organic light emitting display device may include two electrodes and a light emitting layer disposed therebetween. Electrons injected from an electrode and holes injected from another electrode may be combined in the light emitting layer, thereby forming excitons. The excitons may emit light while releasing energy. The organic light emitting display device, which is a self-light emitting device, does not require an additional light source, and thus is advantageous in that it may have a low power consumption, a high response speed, a wide viewing angle, and a high contrast ratio.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure may provide a display device capable of minimizing the number of dark spots that may occur in an organic light emitting element, and a method of fabricating a display device.

However, aspects of the disclosure are not restricted to the one set forth herein. The above and other aspects of the disclosure will become more apparent to one of ordinary skill in the art to which the disclosure pertains by referencing the detailed description of the disclosure given below.

An embodiment of a display device may include a planarization layer disposed on a substrate, a first electrode disposed on the planarization layer and including silver (Ag), a contact preventing layer disposed on the first electrode and including a light absorbing material, the contact preventing layer including a top surface and a side surface extending from an end of the top surface, and a pixel defining layer disposed on the contact preventing layer, the pixel defining layer including a bottom surface facing the top surface of the contact preventing layer, and a side surface extending from an end of the bottom surface. The first electrode may include a first region overlapping the pixel defining layer, the contact preventing layer includes a second region overlapping the first region between the first electrode and the pixel defining layer, and a first edge where the top surface and the side surface of the contact preventing layer meet may be located on the bottom surface of the pixel defining layer.

The first edge of the contact preventing layer may be in direct contact with a second edge where the bottom surface and the side surface of the pixel defining layer meet.

The contact preventing layer may further include a bottom surface that may be opposite to the top surface of the contact preventing layer, the pixel defining layer may further include a top surface that may be opposite to the bottom surface of the pixel defining layer, a third edge where the bottom surface and the side surface of the contact preventing layer meet may protrude more outward than the first edge of the contact preventing layer, and the second edge of the pixel defining layer may protrude more outward than a fourth edge where the top surface and the side surface of the pixel defining layer meet.

An angle between the bottom surface and the side surface of the contact preventing layer may be smaller than an angle between the bottom surface and the side surface of the pixel defining layer.

The side surface of the pixel defining layer may include a round shape.

The side surface of the pixel defining layer may be curved at a portion where the side surface and the top surface of the pixel defining layer meet.

The contact preventing layer may include an inorganic material, and the pixel defining layer may include an organic material.

The display device may further include a sub-contact preventing layer disposed between the planarization layer and the first electrode, wherein the planarization layer may include an organic material, and the sub-contact preventing layer may include an inorganic material.

A second edge where the bottom surface and the side surface of the pixel defining layer meet may protrude more outward than the first edge of the contact preventing layer.

The contact preventing layer and the pixel defining layer may be formed in a same pattern in plan view.

The side surface of the contact preventing layer and the side surface of the pixel defining layer may be aligned with each other, and the entire pixel defining layer may overlap the contact preventing layer.

The contact preventing layer may have an area greater than an area of the pixel defining layer in plan view.

The display device may further include a first opening defined by the contact preventing layer and exposing the first electrode, a second opening overlapping the first opening and defined by the pixel defining layer, a light emitting layer disposed on the first electrode exposed by the first opening, and a second electrode disposed on the light emitting layer. An inner wall of the first opening may coincide with the side surface of the contact preventing layer, an inner wall of the second opening may coincide with the side surface of the pixel defining layer, and an entire area of the first opening may overlap the second opening.

An embodiment of a method of fabricating a display device may include preparing a substrate on which a first electrode may be disposed, forming, on the substrate, an inorganic layer and an organic layer which overlap the first electrode, the organic layer including a light absorbing material, and forming a pixel defining layer and a contact preventing layer that exposes at least a part of the first electrode by patterning the organic layer and the inorganic layer using a photomask. The first electrode may include a first region overlapping the pixel defining layer. The contact preventing layer may include a second region overlapping the first region between the first electrode and the pixel defining layer.

The forming of the pixel defining layer and the contact preventing layer may include performing exposure and development on the organic layer using the photomask, and etching the inorganic layer using the pixel defining layer formed by patterning the organic layer and the inorganic layer.

The etching of the inorganic layer may be performed by dry etching, and the contact preventing layer formed by patterning the organic layer and the inorganic layer may have a pattern same as a pattern of the pixel defining layer in plan view.

The preparing of the substrate may include forming a planarization layer containing an organic material and a sub-contact preventing layer containing an inorganic material between the substrate and the first electrode, and before the inorganic layer is patterned, the first electrode may be capped by the sub-contact preventing layer and the inorganic layer.

A first edge where a top surface and a side surface of the contact preventing layer meet may be located on a bottom surface of the pixel defining layer facing a top surface of the contact preventing layer.

The first edge of the contact preventing layer may be in direct contact with a second edge where the bottom surface and a side surface of the pixel defining layer meet.

A second edge where the bottom surface and a side surface of the pixel defining layer meet may protrude more outward than the first edge of the contact preventing layer.

It may be possible to provide a display device capable of minimizing the number of dark spots that may occur in an organic light emitting element, and a method of fabricating the same.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
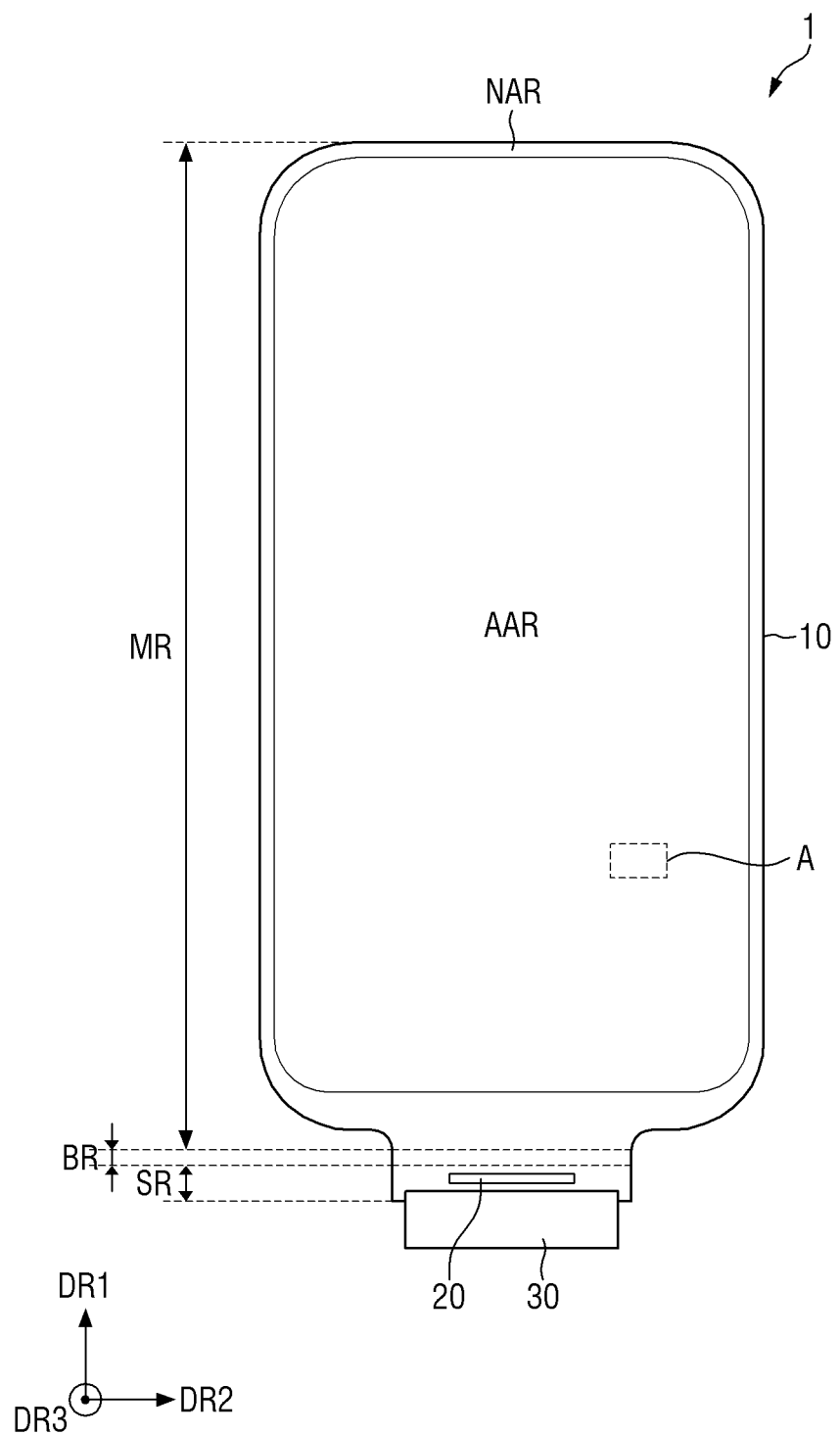
FIG. 1 is a schematic plan view of a display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Use of the singular form (e.g., "a", "an", "the") may include plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Terms such as "overlap" may include layer, stack, face or facing, extending over, extending under, covering or partly covering or any other suitable term as would be appreciated and understood by those of ordinary skill in the art.

"About", "approximately", and "substantially", as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
FIG. 2 is a schematic cross-sectional view of a display device according to an embodiment.

FIG. 1 is a schematic plan view of a display device according to an embodiment. FIG. 2 is a schematic cross-sectional view of a display device according to an embodiment.

Referring to FIGS. 1 and 2, in FIG. 1, a first direction DR1 may indicate a vertical direction of a display device 1 in plan view, and a second direction DR2 may indicate a horizontal direction of the display device 1 in plan view. Further, a third direction DR3 may indicate a thickness direction of the display device 1. The first direction DR1 and the second direction DR2 may perpendicularly intersect each other. The third direction DR3 may be a direction intersecting the plane on which the first direction DR1 and the second direction DR2 may be located, and perpendicularly intersects both the first direction DR1 and the second direction DR2. It should be understood, however, that a direction mentioned in the embodiment refers to a relative direction and the embodiment is not limited to the direction mentioned.

Unless otherwise defined, the terms "above," "top surface," and "upper side" as used herein may refer to a display surface's side of the display device 1, and the terms "below," "bottom surface," and "lower side" as used herein may refer to a side opposite to the display surface of the display device 1.

A display device 1 may be a device for displaying a moving image or a still image. The display device 1 may be used as a display screen of various products such as televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

The display device 1 according to an embodiment may have a substantially rectangular shape in plan view. The display device 1 may have a rectangular shape with right-angled corners in plan view. However, without being limited thereto, the display device 1 may have a rectangular shape with rounded corners in plan view.

The display device 1 includes an active region AAR and a non-active region NAR. In the display device 1, on the assumption that an area where a screen may be displayed may be defined as a display area, an area where a screen may not be displayed may be defined as a non-display area. An area where a touch input may be detected may be defined as a touch area. The display area and the touch area may be included in the active region AAR. The display area and the touch area may overlap each other. In other words, the active region AAR may be a region where the screen may be displayed and the touch input may be detected. The active region AAR may have a rectangular shape or a rectangular shape with rounded corners. However, the disclosure is not limited thereto, and the active region AAR may have various shapes such as a square, other polygons, a circle, an ellipse or the like.

The non-active region NAR may be disposed around the active region AAR. The non-active region NAR may be a bezel area. The non-active region NAR may surround all sides (four sides in the drawing) of the active region AAR. However, the disclosure is not limited thereto, and the non-active region NAR may not be disposed near at least one of the four sides of the active region AAR.

In the non-active region NAR, signal lines or driving circuits for applying a signal to the active region AAR (display area or touch area) may be disposed. The non-active region NAR may not include the display area. Furthermore, the non-active region NAR may not include the touch area. In another embodiment, the non-active region NAR may include a part of the touch area, and a sensor member such as a pressure sensor or the like may be disposed in the non-active region NAR region. In some embodiments, the active region AAR may completely coincide with the display area where the screen may be displayed, and the non-active region NAR may completely coincide with the non-display area where the screen may not be displayed.

The display device 1 may include a display panel 10 which may provide a display screen. Examples of the display panel 10 may include an organic light emitting display panel, a micro LED display panel, a nano LED display panel, a quantum dot light emitting display panel, a liquid crystal display panel, a plasma display panel, a field emission display panel, an electrophoretic display panel, an electrowetting display panel, and the like. In the following description, a case where an organic light emitting display panel may be applied as the display panel 10 will be exemplified, but the disclosure is not limited thereto, and other display panels may be applied within the scope of the same technical ideas.

The display panel 10 may include a flexible substrate including a flexible polymer material such as polyimide. Accordingly, the display panel 10 can be bent, folded or rolled.

The display panel 10 may include a bending region BR, which may be a region in which the panel may be bent. The display panel 10 may be divided into a main region MR located at a side of the bending region BR and a sub-region SR located at another side of the bending region BR.

The display area of the display panel 10 may be disposed in the main region MR. In one embodiment, a peripheral edge portion of the display area in the main region MR, the entire bending region BR, and the entire sub-region SR may be the non-display area. However, the disclosure is not limited thereto, and the bending region BR and/or the sub-region SR may also include the display area.

The main region MR may have a shape substantially similar to an outer shape of the display device 1 in plan view. The main region MR may be a flat region located on a plane. However, the disclosure is not limited thereto, and at least one edge of the remaining edges other than an edge (side) of the main region MR extended to the bending region BR may be bent in a curved shape or bent in a vertical direction.

If at least one of the edges other than the edge of the main region MR extended to the bending region BR may be curved or bent, the display area may also be disposed on the corresponding edge. However, the disclosure is not limited thereto, and the non-display area that does not display a screen may be disposed on the curved or bent edge. In other embodiments, both the display area and the non-display area may be disposed thereon.

The bending region BR may be extended to one side of the main region MR in the first direction DR1. For example, the bending region BR may be extended to the main region MR through a lower short side of the main region MR. The width of the bending region BR may be smaller than the width (width of the short side) of the main region MR. A connection portion between the main region MR and the bending region BR may have an L-shaped cut portion.

In the bending region BR, the display panel 10 may be bent with a curvature downward in a thickness direction, i.e., a direction opposite to a display surface. The bending region BR may have a constant radius of curvature. However, the disclosure is not limited thereto, and the bending region BR may have a different radius of curvature for each section. The surface of the display panel 10 may be reversed as the display panel 10 may be bent in the bending region BR. In other words, one surface of the display panel 10 facing upward may be changed to face outward through the bending region BR and to face downward.

The sub-region SR may extend from the bending region BR. The sub-region SR may extend in a direction parallel to the main region MR from a point where bending may be completed. The sub-region SR may overlap the main region MR in the thickness direction of the display panel 10. The width of the sub-region SR (width in the second direction DR2) may be the same as the width of the bending region BR, but the disclosure is not limited thereto.

A driving chip 20 and a driving substrate 30 may be disposed on the sub-region SR. The driving chip 20 may include an integrated circuit for driving the display panel 10. The integrated circuit may include a display integrated circuit and/or a touch integrated circuit. The display integrated circuit and the touch integrated circuit may be provided as separate chips or may be provided as one integrated chip.

The driving substrate 30 may include display signal line pads, touch signal line pads, or the like. The driving substrate 30 may be extended to one end of the sub-region SR. The driving substrate 30 may be a flexible printed circuit board or film.

Figure 3:
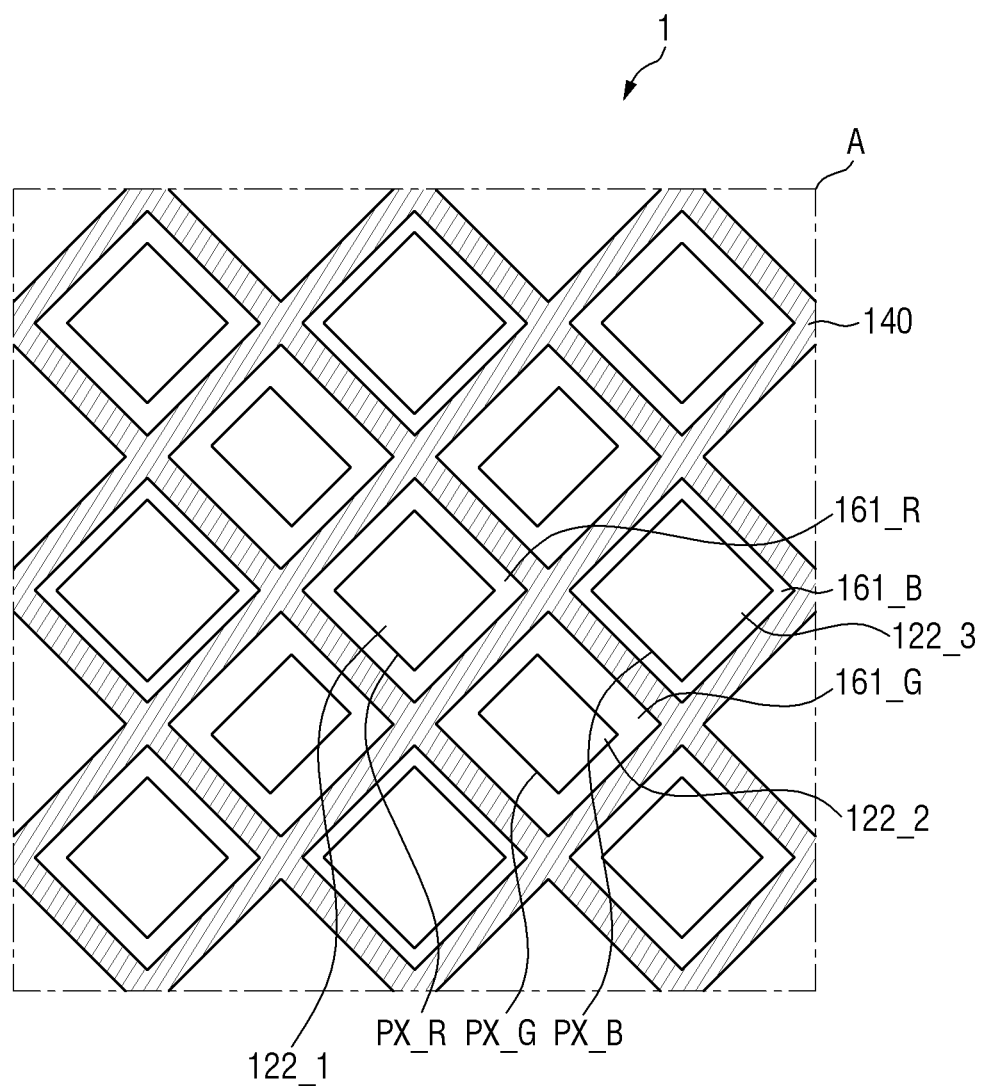
FIG. 3 is a schematic enlarged view of area A of FIG. 1.

FIG. 3 is a schematic enlarged view of portion A of FIG. 1.

Referring to FIG. 3, the display device 1 may include pixels PX_R, PX_G, and PX_B arranged in a matrix shape. The pixels PX_R, PX_G, and PX_B may emit different colors. For example, the pixels may include a first pixel (PX_R, or red pixel) that emits red light, a second pixel (PX_G, or green pixel) that emits green light, and a third pixel (PX_B, or blue pixel) that emits blue light. The pixels may further include a white pixel. Hereinafter, the first pixel PX_R may be referred to as the red pixel PX_R; the second pixel PX_G may be referred to as the green pixel PX_G; and the third pixel PX_B may be referred to as the blue pixel PX_B.

The pixels PX_R, PX_G, and PX_B may be alternately arranged. The pixels PX_R, PX_G, and PX_B may have a quadrilateral shape. The pixels PX_R, PX_G, and PX_B may have different sizes. For example, the blue pixel PX_B may have a size greater than that of the red pixel PX_R, and the red pixel PX_R may have a size greater than that of the green pixel PX_G. However, the relative sizes of the pixels are not limited thereto.

The pixels PX_R, PX_G, and PX_B may include a light emitting layer 122 disposed for each pixel and the respective color filters 161_R, 161_G, and 161_B. The red pixel PX_R may include a first organic light emitting layer 122_1 that emits red light, and a first color filter 161_R that may be a red color filter. The green pixel PX_G may include a second organic light emitting layer 122_2 that emits green light, and a second color filter 161_G that may be a green color filter. The blue pixel PX_B may include a third organic light emitting layer 122_3 that emits blue light, and a third color filter 161_B that may be a blue color filter. In another embodiment, each of the red pixel PX_R, the green pixel PX_G, and the blue pixel PX_B may include a white organic light emitting layer and a corresponding color filter. The white organic light emitting layer may be formed by laminating two or more organic light emitting layers.

Each of the color filters 161_R, 161_G, and 161_B may prevent the emission of light of a color different from a color of each of the corresponding pixels PX_R, PX_G, and PX_B. Although not limited thereto, in one embodiment, the first color filter 161_R may be a red color filter capable of selectively transmitting red light; the second color filter 161_G may be a green color filter capable of selectively transmitting green light; and the third color filter 161_B may be a blue color filter capable of selectively transmitting blue light.

The first color filter 161_R, the second color filter 161_G, and the third color filter 161_B may have substantially the same shape as those of the above-described pixels PX_R, PX_G, and PX_B, respectively. In other words, in case that the pixels PX_R, PX_G, and PX_B have a rhombus shape, the color filters 161_R, 161_G, and 161_B may also have a rhombus shape.

The first color filter 161_R may be disposed at the red pixel PX_R; the second color filter 161_G may be disposed at the green pixel PX_G; and the third color filter 161_B may be disposed at the blue pixel PX_B. By arranging the color filters 161_R, 161_G, and 161_B of the same color above the light emitting layers 122, it may be possible to prevent color mixture in the pixel and to increase color reproducibility. Further, the color filters 161_R, 161_G, and 161_B absorb a considerable amount of external light, so that the reflection of the external light can be reduced without additionally providing a polarizing plate or the like.

A black matrix 140 may be disposed on the boundaries of the pixels PX_R, PX_G, and PX_B. The black matrix 140 may be formed in a grid shape to partition the pixels PX_R, PX_G, and PX_B.

Hereinafter, a cross-sectional structure of the display device 1 according to an embodiment will be described with reference to FIGS. 4 and 5.

Figure 4:
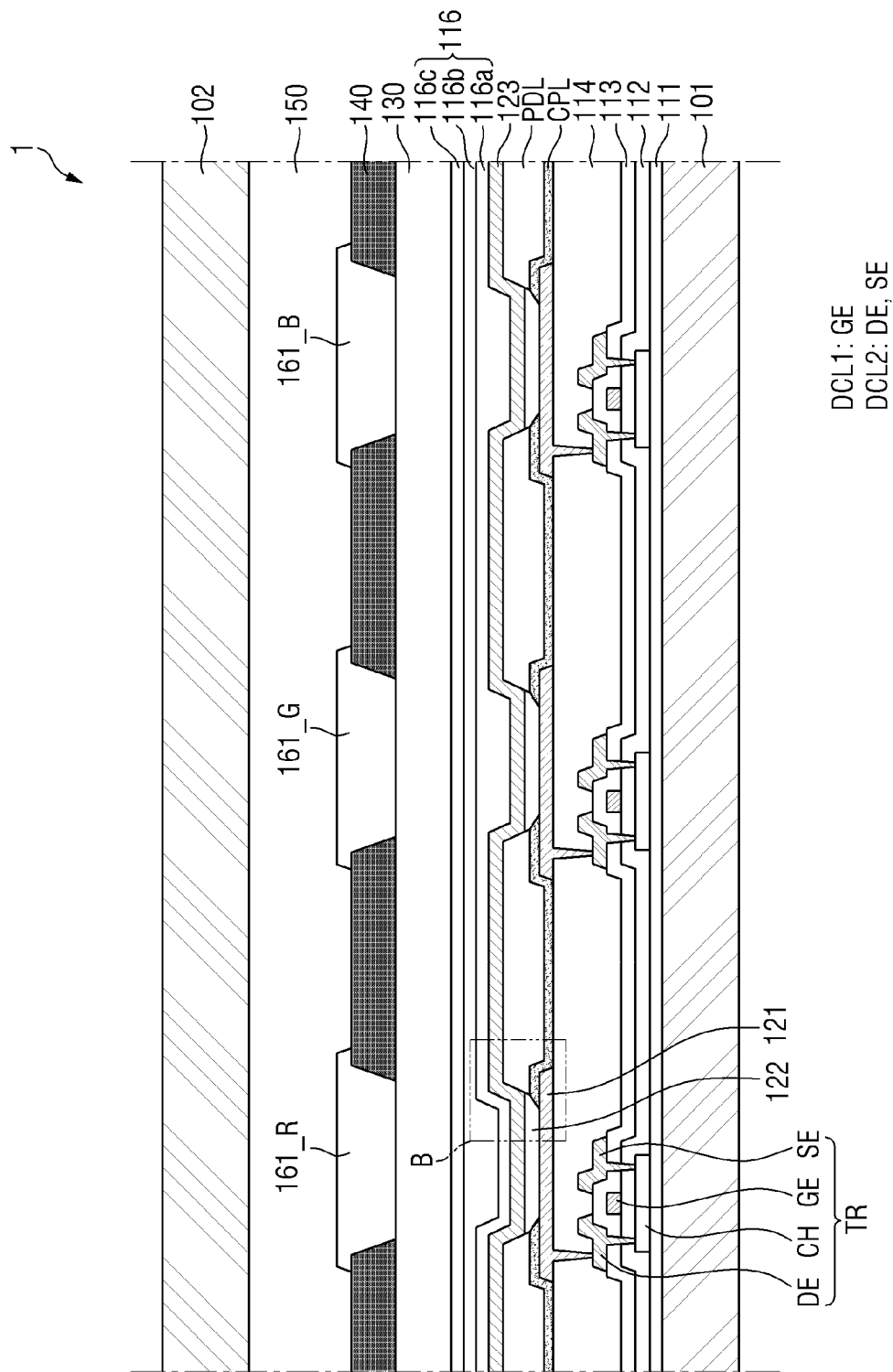
FIG. 4 is a schematic cross-sectional view of a display device according to an embodiment.

FIG. 4 is a schematic cross-sectional view of a display device according to an embodiment. FIG. 5 is an enlarged schematic view of area B of FIG. 4.

Figure 5:
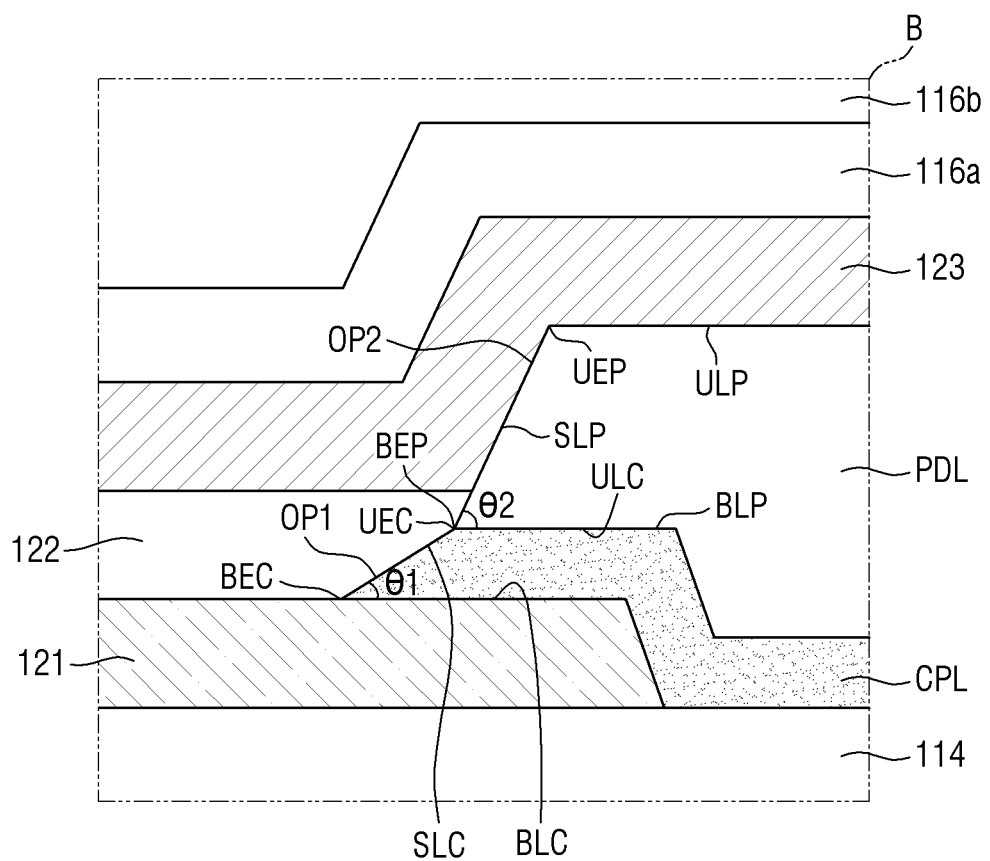
FIG. 5 is an enlarged schematic view of area B of FIG. 4.

Referring to FIGS. 4 and 5, the display device 1 may include a first substrate 101, thin film transistors disposed on the first substrate 101, a storage capacitor, and a light emitting element. The display device 1 may include conductive layers, insulating layers and the like forming the above components. Hereinafter, an organic light emitting diode will be described as the light emitting element, but the light emitting element is not limited thereto.

The first substrate 101 may support the components disposed on the first substrate 101. The first substrate 101 may contain plastic such as polyimide or the like, or may be made of a flexible material that can be twisted, bent, folded, or rolled. However, without being limited thereto, the substrate 101 may contain a transparent insulating material such as glass, quartz, or the like, or a combination thereof.

A buffer layer 111 may be disposed on the first substrate 101. The buffer layer 111 may have a function of flattening the surface of the first substrate 101 and preventing permeation of moisture or external air. The buffer layer 111 may be an inorganic layer. The buffer layer 111 may be a single layer or a multilayer.

A thin film transistor TR may be disposed on the buffer layer 111. Here, the thin film transistor TR may include a driving thin film transistor and a switching thin film transistor. Hereinafter, the driving thin film transistor will be described as the thin film transistor TR. One or more thin film transistors TR may be provided for each pixel. The thin film transistor TR may include a semiconductor layer CH, a gate electrode GE, a source electrode SE, and a drain electrode DE.

Specifically, the semiconductor layer CH may be disposed on the buffer layer 111. The semiconductor layer CH may be made of polycrystalline silicon, monocrystalline silicon, amorphous silicon, or the like, or a combination thereof. However, without being limited thereto, the semiconductor layer CH may contain an oxide semiconductor. Although it is not illustrated, the semiconductor layer CH may include a channel region overlapping the gate electrode GE, and a source region and a drain region respectively disposed at an end and another end of the channel region.

A gate insulating layer 112 may be disposed on the semiconductor layer CH. The gate insulating layer 112 may have a function of insulating the semiconductor layer CH from the gate electrode GE. The gate insulating layer 112 may include an inorganic layer. For example, the gate insulating layer 112 may contain a silicon compound, a metal oxide, or the like, or a combination thereof, but is not limited thereto. The gate insulating layer 112 may be a single layer or a multilayer.

A first conductive layer DCL1 may be disposed on the gate insulating layer 112. The first conductive layer DCL1 may include the gate electrode GE. The first conductive layer DCL1 may be made of a conductive metal material. For example, the first conductive layer DCL1 may include molybdenum (Mo), aluminum (Al), copper (Cu), titanium (Ti), or a combination thereof. The first conductive layer DCL1 may be a single layer or a multilayer.

An interlayer insulating layer 113 may be disposed on the first conductive layer DCL1. The interlayer insulating layer 113 may insulate the first conductive layer DCL1 from the second conductive layer DCL2 while being disposed therebetween. The interlayer insulating layer 113 may include an inorganic layer. Although not limited thereto, the interlayer insulating layer 113 may include a silicon compound, a metal oxide, or the like, or a combination thereof. The interlayer insulating layer 113 may be a single layer or a multilayer.

The second conductive layer DCL2 may be disposed on the interlayer insulating layer 113. The second conductive layer DCL2 may include the source electrode SE and the drain electrode DE. The source electrode SE and the drain electrode DE may be electrically connected to the source region and the drain region of the semiconductor layer CH, respectively, through contact holes penetrating through the interlayer insulating layer 113 and the gate insulating layer 112. The second conductive layer DCL2 may be made of a conductive metal material. For example, the second conductive layer DCL2 may contain aluminum (Al), copper (Cu), titanium (Ti), molybdenum (Mo), or a combination thereof. Although it is not illustrated, the second conductive layer DCL2 may further include a high potential voltage line, a low potential voltage line, data lines, and the like, but is not limited thereto.

A planarization layer 114 may be disposed on the second conductive layer DCL2. Here, the planarization layer 114 may be disposed on the interlayer insulating layer 113 while covering the second conductive layer DCL2. The planarization layer 114 may contain an organic insulating material. In case that the planarization layer 114 contains an organic material, the planarization layer 114 may have a substantially flat top surface although a stepped portion may be formed at a lower portion thereof.

Although not illustrated, a passivation layer that covers the second conductive layer DCL2 may be further disposed below a via layer VIA.

First electrodes 121 may be disposed on the planarization layer 114. The first electrode 121 may be disposed separately for each pixel. In other words, the first electrode 121 may be a pixel electrode disposed separately for each pixel. Further, the first electrode 121 may be an anode electrode of an organic light emitting diode. The first electrode 121 may be electrically connected to the drain electrode DE (or the source electrode SE) of the thin film transistor TR through a through-hole penetrating through the planarization layer 114.

The first electrode 121 may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but is not limited thereto. The layer having a high work function may be disposed above the reflective material layer and disposed closer to a light emitting layer 122. The first electrode 121 may have a multilayer structure such as ITO/Mg, ITO/MgF, ITO/Ag and ITO/Ag/ITO, but is not limited thereto.

A contact preventing layer CPL may be disposed on the first electrode 121. The contact preventing layer CPL may be disposed between the first electrode 121 and a pixel defining layer PDL and may prevent direct contact between the first electrode 121 and the pixel defining layer PDL. In other words, the first electrode 121 and the pixel defining layer PDL may overlap each other in at least a partial region. The contact preventing layer CPL may be disposed between the first electrode 121 and the pixel defining layer PDL and may include a region overlapping the partial region.

The contact preventing layer CPL may cover the side surface as well as the top surface of the first electrode 121. The contact preventing layer CPL may be disposed on the top surface of the first electrode 121 near the edge of the first electrode 121 to cover a part of the top surface of the first electrode 121. The contact preventing layer CPL may be disposed on the side surface of the first electrode 121 to cover the side surface of the first electrode 121.

The contact preventing layer CPL may have a bottom surface BLC, a top surface ULC opposite to the bottom surface BLC, and a side surface SLC that connects the bottom surface BLC and the top surface ULC. The bottom surface BLC of the contact preventing layer CPL may be disposed on the top surface and the side surface of the first electrode 121 and on the top surface of the planarization layer 114. The bottom surface BLP of the pixel defining layer PDL may be disposed on the top surface ULC of the contact preventing layer CPL. The light emitting layer 122 may be disposed on the side surface SLC of the contact preventing layer CPL. Although not limited thereto, the bottom surface BLC of the contact preventing layer CPL may be brought into direct contact with the top surface and the side surface of the first electrode 121 and may also be brought into direct contact with the top surface of the planarization layer 114. The top surface ULC of the contact preventing layer CPL may be brought into direct contact with the bottom surface BLP of the pixel defining layer PDL. The side surface SLC of the contact preventing layer CPL may be brought into direct contact with the light emitting layer 122.

The contact preventing layer CPL may include a first opening OP1 exposing at least a part of the first electrode 121. In other words, the first opening OP1 may expose the first electrode 121 disposed therebelow, and may be defined by the contact preventing layer CPL. The inner wall of the first opening OP1 may coincide with the side surface SLC of the contact preventing layer CPL.

The thickness of the contact preventing layer CPL may be within a range of about 0.2 mm to about 0.4 mm, but the disclosure is not limited thereto. The contact preventing layer CPL may contain an inorganic material. The contact preventing layer CPL may contain, e.g., silicon nitride (SiNx) or the like, but is not limited thereto. The thickness of the pixel defining layer PDL may be greater than that of the contact preventing layer CPL.

By providing the contact preventing layer CPL between the first electrode 121 and the pixel defining layer PDL, direct contact between the first electrode 121 and the pixel defining layer PDL can be prevented, and diffusion of a part of the material of the pixel defining layer PDL to the first electrode 121 can be prevented. Accordingly, it may be possible to suppress or prevent the occurrence of dark spots due to contact between the pixel defining layer PDL and the first electrode 121 or due to diffusion of a part of the material of the pixel defining layer PDL. This will be described in detail later.

The pixel defining layer PDL may be disposed on the contact preventing layer CPL. The pixel defining layer PDL may be made of a material different from a material forming the contact preventing layer CPL. The pixel defining layer PDL may contain an organic material and may further contain a light absorbing material. The light absorbing material may absorb light having a visible light wavelength band. The light absorbing material may include, e.g., a black pigment, a black dye, or a combination thereof, but is not limited thereto. The organic material may include, e.g., a polyacrylate-based resin, a polyimide-based resin, or the like, or a combination thereof, but is not limited thereto.

The pixel defining layer PDL may have a bottom surface BLP, a top surface ULP opposite to the bottom surface BLP, and a side surface SLP that connects the bottom surface BLP and the top surface ULP. The bottom surface BLP of the pixel defining layer PDL may be disposed on the top surface ULC of the contact preventing layer CPL. A second electrode 123 may be disposed on the top surface ULP of the pixel defining layer PDL. A light emitting layer 122 and/or the second electrode 123 may be disposed on the side surface SLP of the pixel defining layer PDL. Although not limited thereto, the bottom surface BLP of the pixel defining layer PDL may be brought into direct contact with the top surface and the side surface of the first electrode 121, and may also be brought into direct contact with the top surface of the planarization layer 114. The top surface ULP of the pixel defining layer PDL may be brought into direct contact with the bottom surface BLP of the pixel defining layer PDL. The side surface SLP of the pixel defining layer PDL may be brought into direct contact with the light emitting layer 122 and/or the second electrode 123.

The pixel defining layer PDL may include a second opening OP2 overlapping the first opening OP1 of the contact preventing layer CPL. In other words, the second opening OP2 overlapping the first opening OP1 may expose the first electrode 121 disposed therebelow, and may be defined by the pixel defining layer PDL. The inner wall of the second opening OP2 may coincide with the side surface SLP of the pixel defining layer PDL. The second opening OP2 of the pixel defining layer PDL may overlap the entire area of the first opening OP1 of the contact preventing layer CPL, but the disclosure is not limited thereto.

The pixel defining layer PDL may be formed in substantially the same pattern as that of the contact preventing layer CPL in plan view. The pattern of the contact preventing layer CPL in plan view may be substantially the same as that of the pixel defining layer PDL in plan view, and may have a shape extended from the pattern of the pixel defining layer PDL in plan view. In other words, the area of the contact preventing layer CPL in plan view may be greater than that of the pixel defining layer PDL in plan view. The area of the contact preventing layer CPL in plan view may be measured with respect to the bottom surface BLC of the contact preventing layer CPL, and the area of the pixel defining layer PDL in plan view may be measured with respect to the bottom surface BLP of the pixel defining layer PDL. The entire pixel defining layer PDL may overlap the contact preventing layer CPL in a thickness direction (the third direction DR3 (see FIG. 1)).

The contact preventing layer CPL may further have an upper edge UEC where the top surface ULC and the side surface SLC meet and a lower edge BEC where the bottom surface BLC and the side surface SLC meet. The pixel defining layer PDL may further have an upper edge UEP where the top surface ULP and the side surface SLP meet and a lower edge BEP where the bottom surface BLP and the side surface SLP meet.

The side surface SLC of the contact preventing layer CPL may protrude more outward than the side surface SLP of the pixel defining layer PDL. Specifically, the lower edge BEC of the contact preventing layer CPL may protrude more outward than the upper edge UEC of the contact preventing layer CPL, and the lower edge BEP of the pixel defining layer PDL may protrude more outward than the upper edge UEP of the pixel defining layer PDL. In other words, the lower edge BEC of the contact preventing layer CPL may be disposed closer to the inside of the first opening OP1 than the upper edge UEC of the contact preventing layer CPL, and the lower edge BEP of the pixel defining layer PDL may be disposed closer to the inside of the second opening OP2 than the upper edge UEP of the pixel defining layer PDL.

The upper edge UEC of the contact preventing layer CPL may be disposed on the bottom surface BLP of the pixel defining layer PDL. The upper edge UEC of the contact preventing layer CPL may be brought into direct contact with the bottom surface BLP of the pixel defining layer PDL, but the disclosure is not limited thereto. Further, the upper edge UEC of the contact preventing layer CPL may meet the lower edge BEP of the pixel defining layer PDL and be in direct contact therewith. In other words, the upper edge UEC of the contact preventing layer CPL and the lower edge BEP of the pixel defining layer PDL may substantially coincide with each other. The upper edge UEC of the contact preventing layer CPL and the lower edge BEP of the pixel defining layer PDL may have substantially the same shape and position. Further, the side surface SLC of the contact preventing layer CPL may be substantially extended from the side surface SCP of the pixel defining layer PDL.

The side surface SLC of the contact preventing layer CPL and the side surface SLP of the pixel defining layer PDL may have different inclinations in cross-sectional view. Specifically, an angle θ1 formed by the bottom surface BLC of the contact preventing layer CPL and the side surface SLC of the contact preventing layer CPL may be smaller than or equal to an angle θ2 formed by the bottom surface BLP of the pixel defining layer PDL and the side surface SLP of the pixel defining layer PDL. Further, although it is not illustrated, the angle formed by the extension line of the side surface SLC of the contact preventing layer CPL and the first substrate 101 may be smaller than or equal to the angle formed by the extension line of the side surface SLP of the pixel defining layer PDL and the first substrate 101. Although not limited thereto, in case that the angle θ1 formed by the bottom surface BLC of the contact preventing layer CPL and the side surface SLC of the contact preventing layer CPL may be the same as the angle θ2 formed by the bottom surface BLP of the pixel defining layer PDL and the side surface SLP of the pixel defining layer PDL, the side surface SLC of the contact preventing layer CPL and the side surface SLC of the pixel defining layer PDL may be disposed on substantially the same plane.

The light emitting layer 122 may be disposed on the first electrode 121 exposed by the first opening OP1 of the contact preventing layer CPL and the second opening OP2 of the pixel defining layer PDL. The light emitting layer 122 may include an organic material layer. The organic material layer of the light emitting layer may include an organic light emitting layer, and may further include a hole injecting/transporting layer and/or an electron injecting/transporting layer.

The second electrode 123 may be disposed on the light emitting layer 122. The second electrode 123 may be disposed not only on the light emitting layer 122 but also on the pixel defining layer PDL. The second electrode 123 may be a common electrode extended across all pixels. In other words, the second electrode 123 may be a cathode electrode of an organic light emitting diode that may be extended across all pixels.

The cathode electrode CAT may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The cathode electrode CAT may further include a transparent metal oxide layer disposed on the material layer having a low work function.

The first electrode 121, the light emitting layer 122, and the second electrode 123 may form an organic light emitting diode.

An encapsulation layer 116 may be disposed on the second electrode 123. The encapsulation layer 116 may include at least one inorganic layer and at least one organic layer. The encapsulation layer 116 may include a first inorganic layer 116a, a first organic layer 116b, and a second inorganic layer 116c. Although it is not illustrated, the first inorganic layer 116a and the second inorganic layer 116c may be brought into contact with each other at the end portion of the encapsulation layer 116. The first organic layer 116b may be sealed by the first inorganic layer 116a and the second inorganic layer 116c.

Each of the first inorganic layer 116a and the second inorganic layer 116c may contain silicon nitride, silicon oxide, silicon oxynitride, or the like, or a combination thereof. The first organic layer 116b may contain an organic insulating material.

The display device 1 according to one embodiment may further include a touch member 130, a black matrix 140, color filters 161_R, 161_G, and 161_B, an adhesive layer 150, and a second substrate 102.

The touch member 130 may be disposed on the encapsulation layer 116. The touch member 130 may detect a touch input. The touch member 130 may be provided in the form of a touch layer inside the display panel 10. In the following embodiment, a case in which the touch member 130 may be provided inside the display panel 10 and included in the display panel 10 is illustrated, but the disclosure is not limited thereto. The touch member 130 may be provided as a separate panel from the display panel 10 or as a film and attached to the display panel 10.

The black matrix 140 may be disposed on the touch member 130. The black matrix 140 may be disposed along the boundaries of the pixels and may include openings exposing the pixels. The black matrix 140 may have a grid shape extended to each other along the boundaries of the pixels. The lower light emitting layer 122 may overlap the openings of the black matrix 140. In this specification, the expression "first and second components overlap each other" may mean that the first and second components overlap each other in the thickness direction (the direction perpendicular to the surface of the first substrate in the drawing) of the display device 1.

The black matrix 140 may contain a light absorbing material or a light reflecting material. For example, the black matrix 140 may contain a resin colored with black, a reflective metal such as chromium (Cr), or the like, or a combination thereof. On the other hand, although it is not illustrated in the drawing, a buffer layer or an organic layer may be further disposed between the black matrix 140 and the touch member 130.

The color filters 161_R, 161_G, and 161_B may be disposed on the black matrix 140. The color filters 161_R, 161_G, and 161_B may be disposed on the openings of the black matrix 140 and may be extended to the top surface of the black matrix 140. Although the adjacent color filters 161_R, 161_G, and 161_B may be separated from each other in the drawing, the disclosure is not limited thereto, and the adjacent color filters 161_R, 161_G, and 161_B may overlap each other on the black matrix 140.

The adhesive layer 150 and the second substrate 102 may be sequentially disposed on the color filters 161_R, 161_G, and 161_B. Since the color filters 161_R, 161_G, and 161_B have been described, a redundant description thereof will be omitted.

The second substrate 102 may serve to protect the components disposed therebelow. The second substrate 102 may serve as a window substrate, a sealing substrate, a protective substrate, or the like. The second substrate 102 may contain transparent glass, plastic, or the like.

The adhesive layer 150 may be interposed between the color filter and the second substrate 102 to bond the color filter and the second substrate 102. The adhesive layer 150 may be optically clear and may have an adhesive property. The adhesive layer 150 may include an optically clear adhesive (OCA), an optically clear resin (OCR), or the like, or a combination thereof.

Hereinafter, a method of fabricating a display device 1 according to an embodiment will be described.

Figure 6:
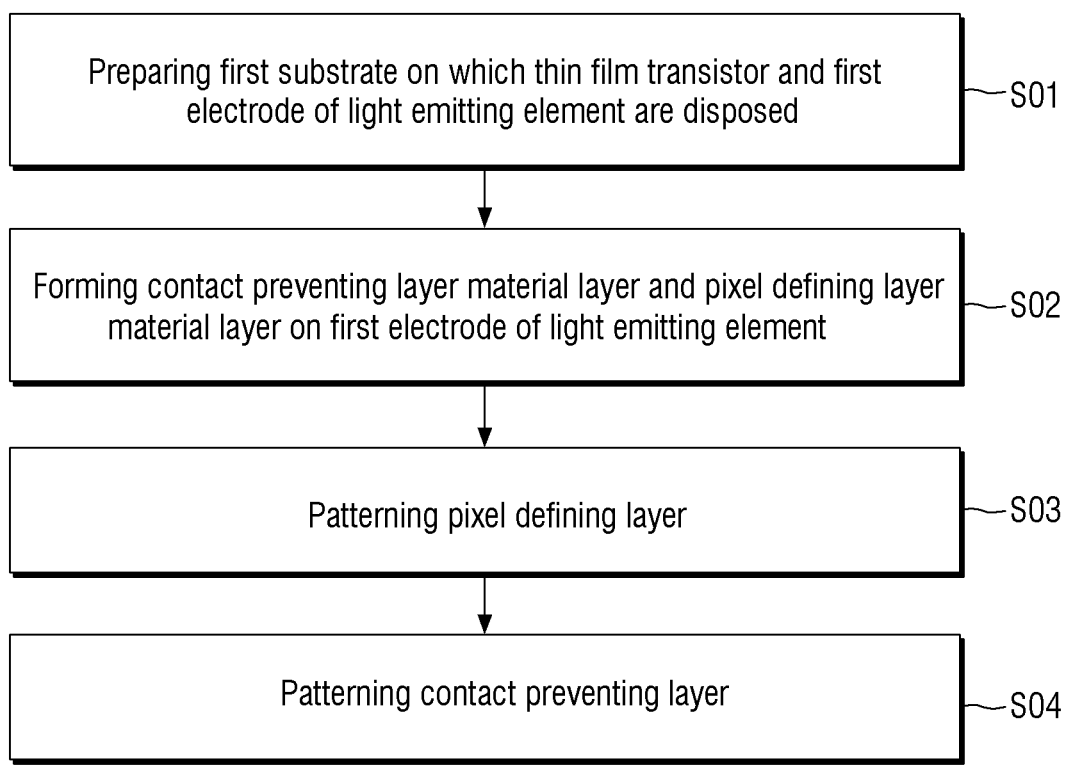
FIG. 6 is a flowchart showing a sequence of fabricating a display device according to an embodiment.

FIG. 6 is a flowchart showing a sequence of fabricating a display device according to an embodiment. FIGS. 7 to 10 are schematic cross-sectional views showing the steps of a method of fabricating a display device according to an embodiment. FIG. 11 is an enlarged schematic view of area C of FIG. 10.

Figure 7:
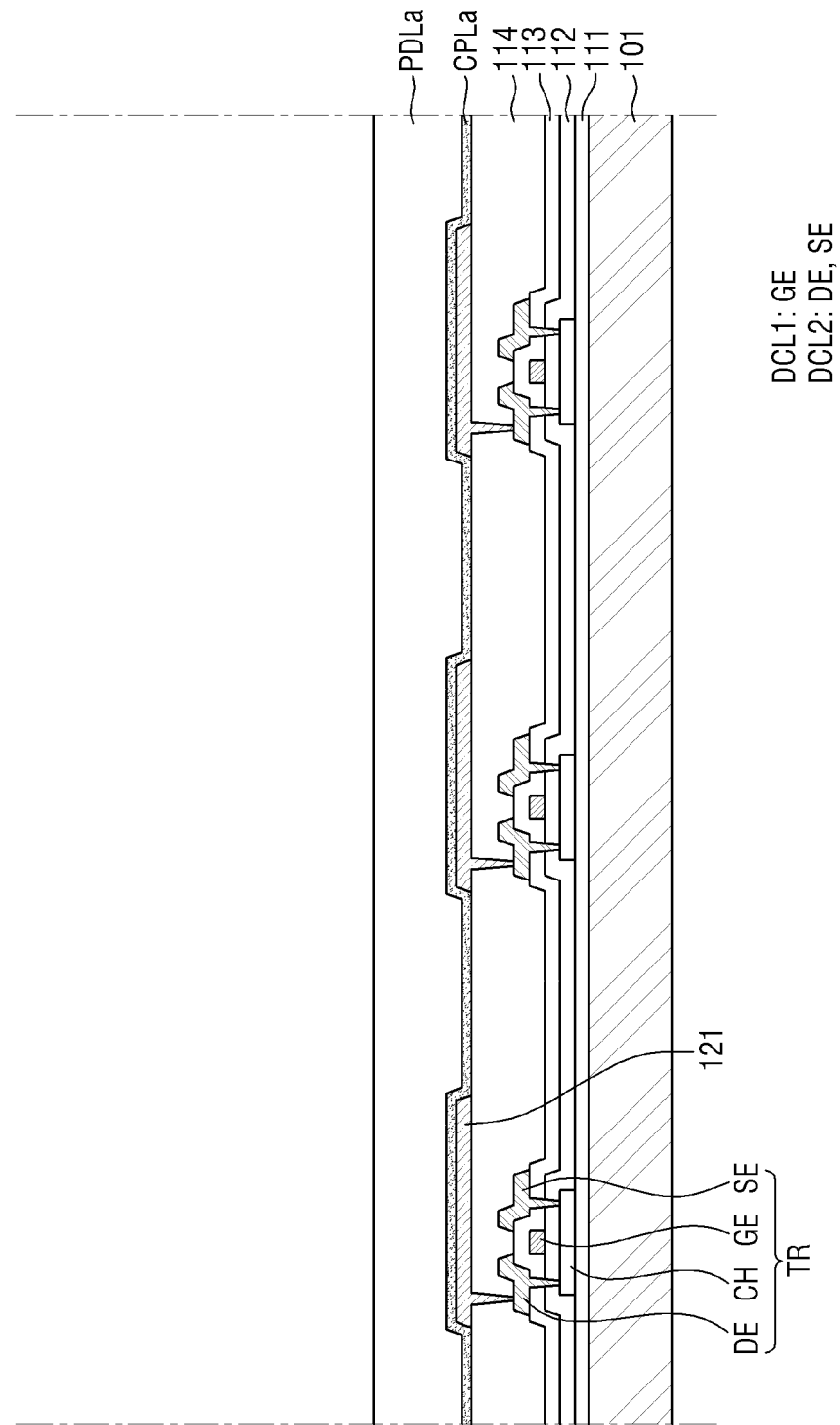
FIGS. 7 to 10 are schematic cross-sectional views showing the steps of a method of fabricating a display device according to an embodiment.

Referring to FIGS. 6 and 7, a first substrate 101 on which a thin film transistor TR may be disposed may be prepared, and a contact preventing layer material layer CPLa and a pixel defining layer material layer PDLa may be formed on the first substrate 101 on which the thin film transistor TR may be disposed (steps S01 and S02). Since the method of forming, on the first substrate 101, the thin film transistor TR, the insulating layers 111, 112, and 113 disposed between the components of the thin film transistor TR, the planarization layer 114 that covers the thin film transistor TR, and the first electrode 121 disposed on the planarization layer 114 is well known, a detailed description thereof will be omitted.

The contact preventing layer material layer CPLa and the pixel defining layer material layer PDLa may be sequentially disposed on the first electrode 121. The contact preventing layer material layer CPLa and the pixel defining layer material layer PDLa may be disposed on the entire planarization layer 114 while covering the first electrode 121. The contact preventing layer material layer CPLa may be an inorganic layer containing an inorganic material, and the pixel defining layer material layer PDLa may be an organic layer containing an organic material.

Figure 8:
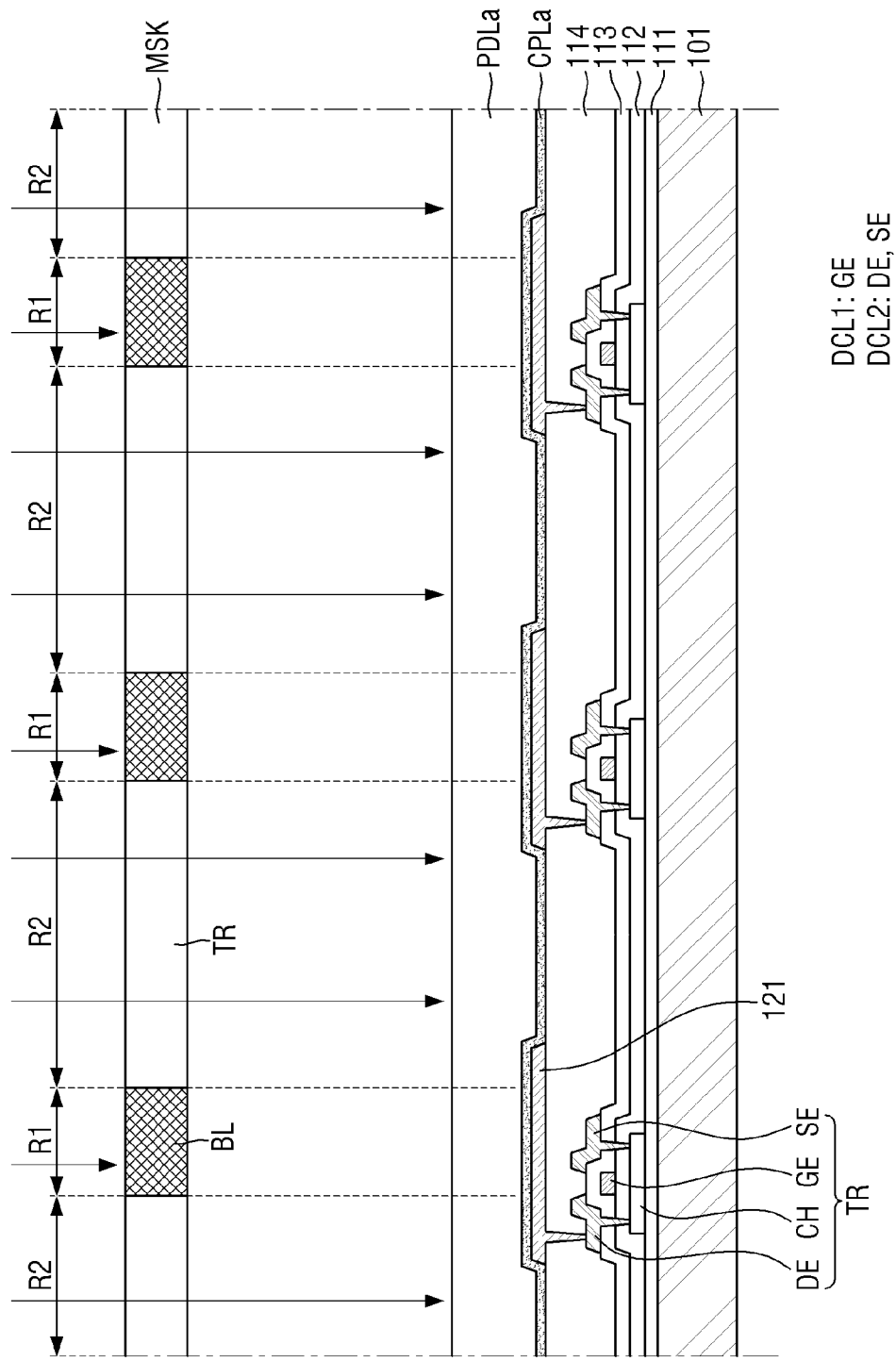
Figure 9:
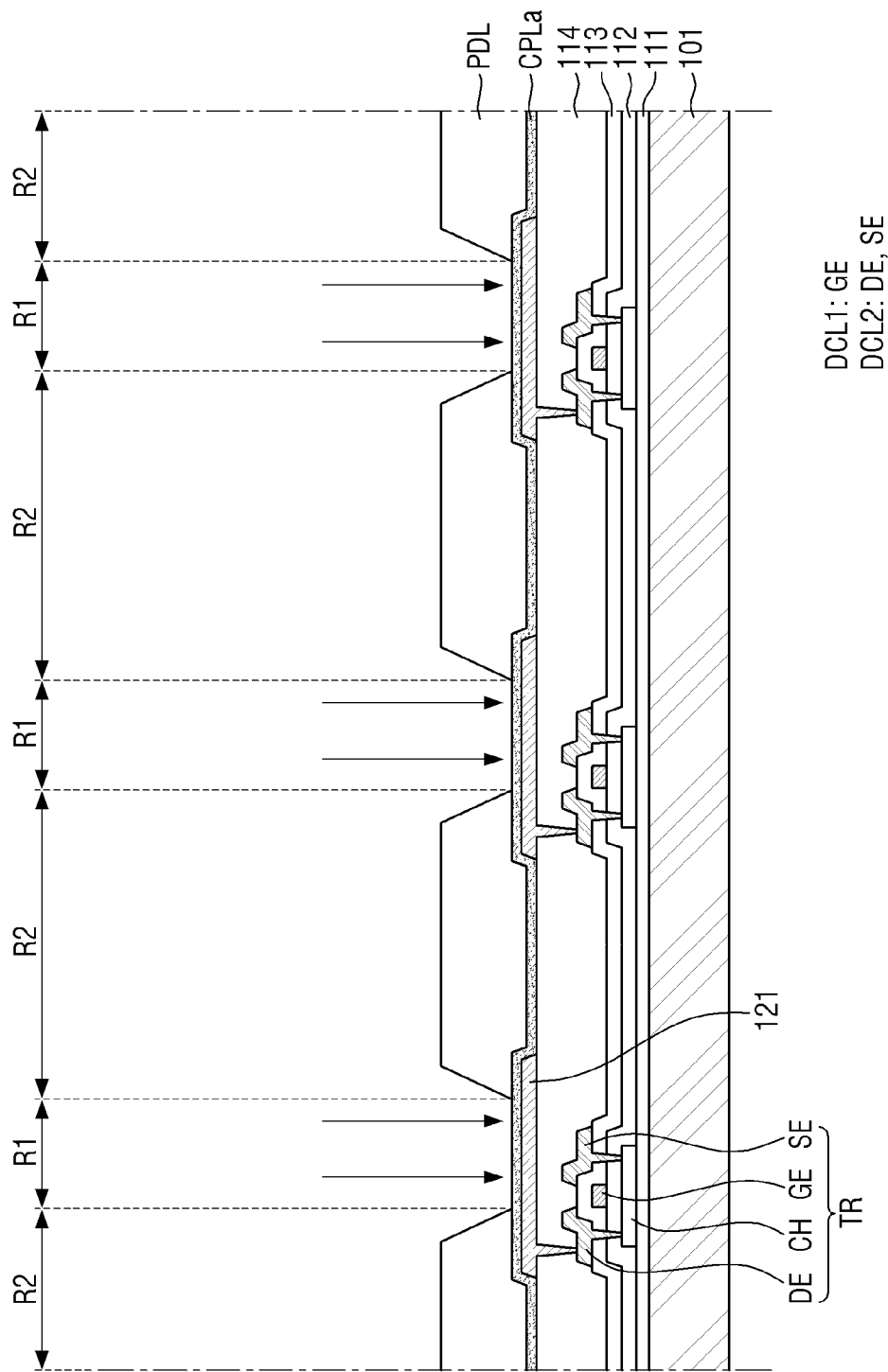

Referring to FIGS. 8 and 9, the pixel defining layer material layer PDLa disposed on the entire surface may be patterned to form a pixel defining layer PDL (step S03). The pixel defining layer PDL may include, e.g., an organic material having a photosensitive material. The patterned pixel defining layer PDL may be formed by coating the pixel defining layer material layer PDLa and performing exposure and development.

Specifically, the pixel defining layer material layer PDLa may be patterned using a photomask MSK disposed above the pixel defining layer material layer PDLa. The photomask MSK may include regions BL and TR having different light transmittances. In other words, the photomask MSK may be divided into a light blocking portion BL and a light transmitting portion TR based on the light transmittance. The light transmittance of the light blocking portion BL may be smaller than that of the light transmitting portion TR.

The pixel defining layer material layer PDLa may be divided into a first region R1 and a second region R2. The first region R1 of the pixel defining layer material layer PDLa may correspond to the light blocking portion BL of the photomask MSK, and the second region R2 of the pixel defining layer material layer PDLa may correspond to the light transmitting portion TR of the photomask MSK.

The light blocking portion BL may block the light from the outside to prevent the light from reaching the first region R1 of the pixel defining layer material layer PDLa. The light transmitting portion TR may transmit most of the light provided from the outside to allow most of the light to reach the second region R2 of the pixel defining layer material layer PDLa.

For example, in case that the pixel defining layer material layer PDLa contains a negative sensitizer, the exposed portion (the second region R2) may be hardened and become insoluble in a developer. At this time, any one of a portion of the pixel defining layer material layer PDLa that may be exposed to the light and a portion of the pixel defining layer material layer PDLa that may not be exposed to the light may be selectively removed depending on chemical change characteristics using a developing solution. Accordingly, the pixel defining layer PDL shown in FIG. 9 may be patterned by selectively removing the pixel defining layer material layer PDLa in the first region R1.

However, in case that the pixel defining layer material layer PDLa contains a positive sensitizer, whether the pixel defining layer material layer PDLa remains in the first region R1 or in the second region R2 may be reversed.

In the process of forming the pixel defining layer PDL, the pixel defining layer material layer PDLa may not be in contact with the first electrode 121. In other words, the contact preventing layer material layer CPLa may be disposed between the pixel defining layer material layer PDLa and the first electrode 121, and the contact preventing layer material layer CPLa may be disposed on the entire planarization layer 114 while covering the first electrode 121, so that the pixel defining layer material layer PDLa may not be in contact with the first electrode 121. The patterned pixel defining layer PDL may also not be in contact with the first electrode 121. Further, the contact preventing layer material layer CPLa may prevent gas or the like discharged from the pixel defining layer material layer PDLa from being diffused to the first electrode 121. In other words, the contact preventing layer material layer CPLa may block chlorine gas ($Cl_2$), hydrogen chloride gas (HCl), chlorine ions ($Cl^-$) and the like that may be discharged from the pixel defining layer material layer PDLa and diffused to the first electrode 121.

Therefore, by providing the contact preventing layer material layer CPLa between the pixel defining layer material layer PDLa and the first electrode 121, it may be possible to suppress or prevent the materials contained in the pixel defining layer material layer PDLa from reacting with silver (Ag) of the first electrode 121, and also possible to minimize the number of dark spots of the first electrode 121 that may occur due to the reaction. Accordingly, the reliability of the display device 1 (see FIG. 1) can be improved.

Figure 10:
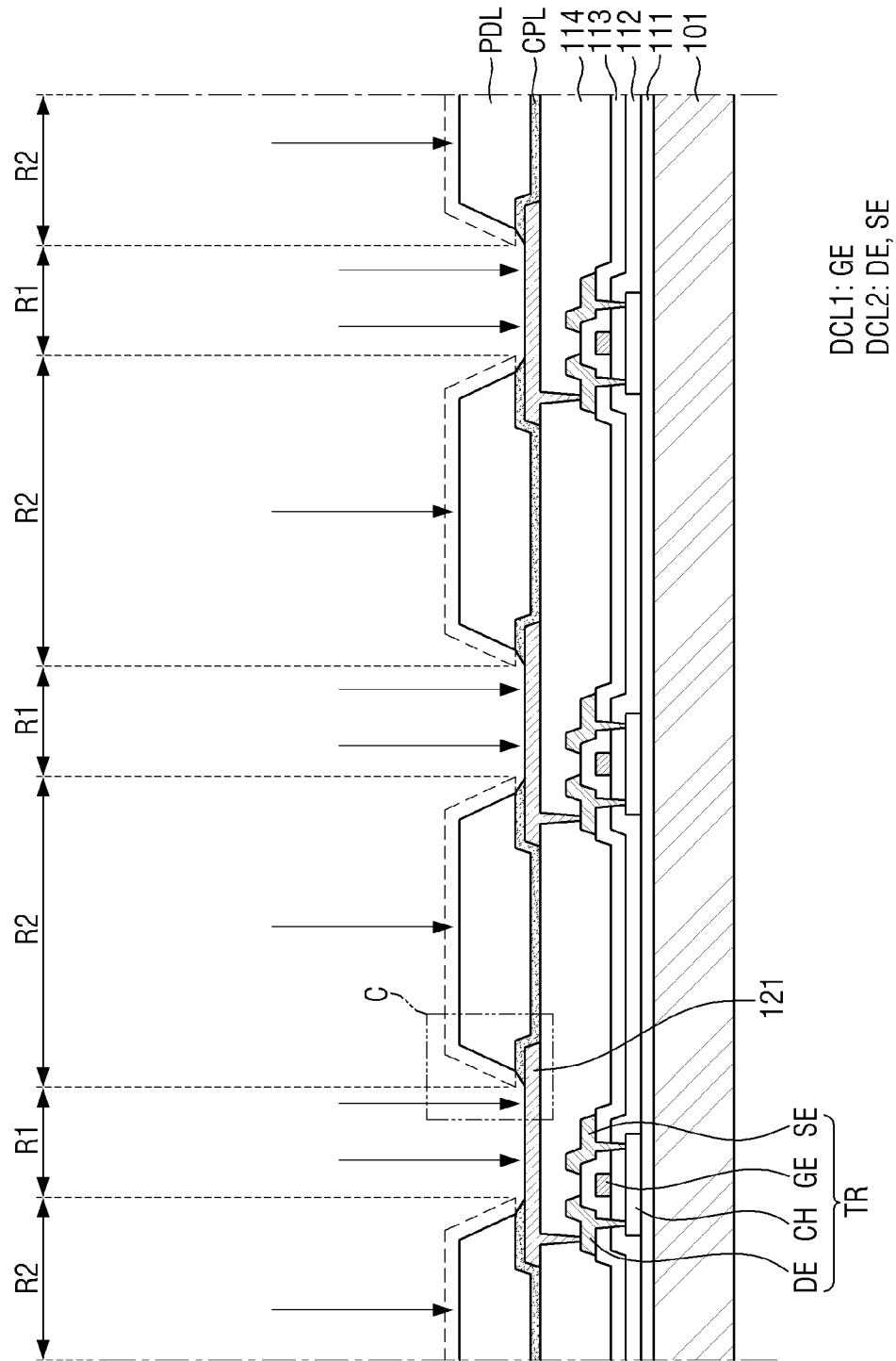
Figure 11:
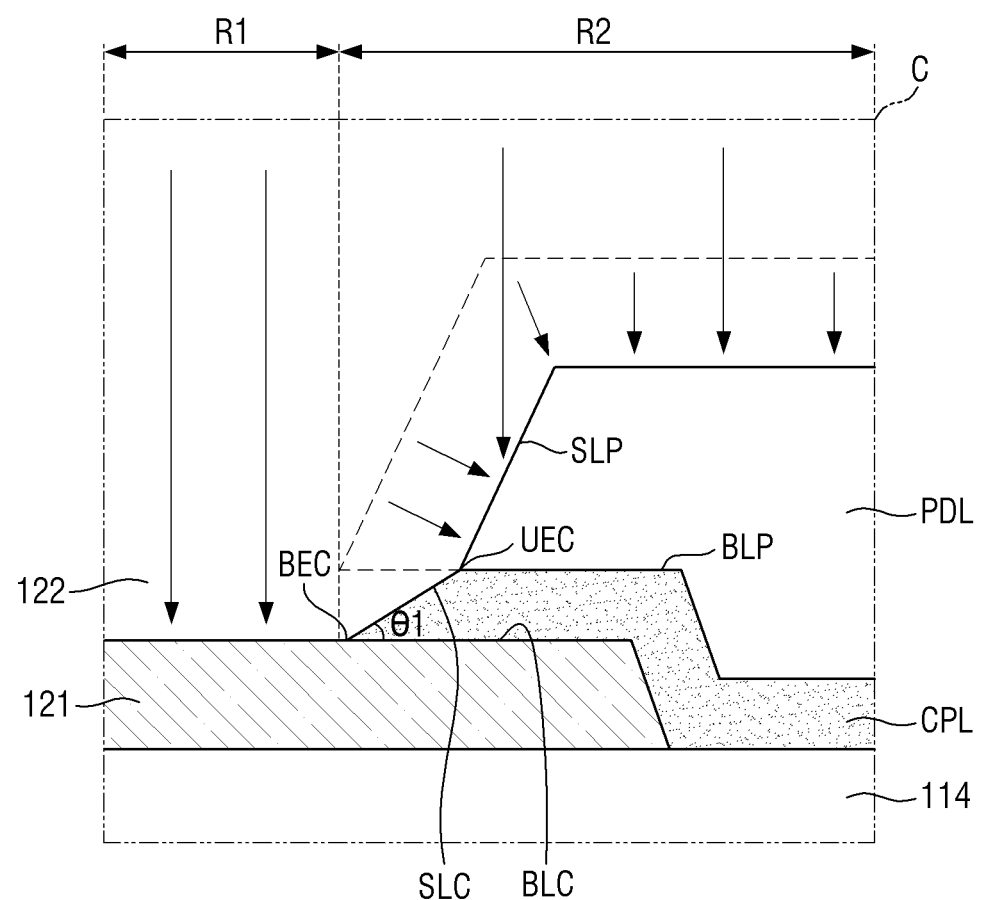
FIG. 11 is an enlarged schematic view of area C of FIG. 10.

Referring to FIGS. 10 and 11, the contact preventing layer material layer CPLa disposed on the entire surface may be patterned to form a contact preventing layer CPL (step S04).

Specifically, the contact preventing layer CPL may be formed using the patterned pixel defining layer PDL disposed thereon as an etching mask. In other words, a part of the contact preventing layer material layer CPLa may be exposed by the patterned pixel defining layer PDL disposed thereon, and the exposed part may be removed by etching. The contact preventing layer material layer CPLa may be patterned by dry etching to form the contact preventing layer CPL, but the disclosure is not limited thereto.

In the process of forming the contact preventing layer CPL, a part of the pixel defining layer PDL may also be etched. Accordingly, the size of the pixel defining layer PDL may be reduced. Since a part of the pixel defining layer PDL may be etched during the process of etching the contact preventing layer material layer CPLa, the side surface SLP of the pixel defining layer PDL may be located closer to the inside of the second region R2 than the conventional position. In other words, since a part of the pixel defining layer PLD may be etched, the position of the side surface SLP of the pixel defining layer PDL may be moved.

As the position of the side surface SLP of the pixel defining layer PDL may be moved, a part of the contact preventing layer material layer CPLa located in the second region R2 may be exposed in the process of etching the contact preventing layer material layer CPLa. Therefore, not only the contact preventing layer material layer CPLa located in the first region R1 but also a part of the contact preventing layer material layer CPLa located in the second region R2 may be etched.

However, even if a part of the contact preventing layer material layer CPLa located in the second region R2 may be exposed, the exposure time may be different. In other words, a portion closer to the boundary between the first region R1 and the second region R2 may be exposed longer. A degree of etching of the contact preventing layer material layer CPLa may be different depending on the exposure time, so that the side surface SLC of the contact preventing layer CPL may be inclined at the constant angle θ1 with respect to the bottom surface BLC. Further, the lower edge BEC of the contact preventing layer CPL may be disposed on the first electrode 121, and the upper edge UEC of the contact preventing layer CPL may be disposed on the bottom surface BLP of the pixel defining layer PDL. Further, the lower edge BEC of the contact preventing layer CPL may be disposed more outward than the upper edge UEC of the contact preventing layer CPL.

Since the contact preventing layer CPL may be patterned using the patterned pixel defining layer PDL as an etching mask, even if the contact preventing layer CPL may be additionally formed, an additional mask for patterning the contact preventing layer CPL may not be required. In other words, since the pixel defining layer PDL and the contact preventing layer CPL may be patterned using one mask MSK (see FIG. 8), the number of processes may not be increased even if the contact preventing layer CPL may be further formed. Therefore, even if the contact preventing layer CPL may be further formed, it may be possible to prevent a decrease in the processing efficiency, and also possible to prevent an increase in the processing cost.

By patterning the pixel defining layer PDL and patterning the contact preventing layer CPL, the pixel defining layer material layer PDLa may not remain on the first electrode 121 in the first region R1. By etching a part of the contact preventing layer material layer CPLa exposed by the pixel defining layer PDL, the pixel defining layer material layer PDLa that may remain on the first electrode 121 of the first region R1 may also be removed in the process of patterning the pixel defining layer PDL. Therefore, in the first region R1, most of the pixel defining layer material layer PDLa may not remain on the first electrode 121, and the pixel defining layer PDL and the first electrode 121 may not be in contact with each other as described above. Therefore, the occurrence of dark spots can be further suppressed or prevented, and the reliability of the display device 1 (see FIG. 1) can be further improved.

Further, the processing efficiency can be improved by omitting an additional process for removing the residue of the pixel defining layer PDL remaining on the first electrode 121 after the patterning of the pixel defining layer PDL.

The method of forming, on the pixel defining layer PDL, the light emitting layer 122, the second electrode 123, the encapsulation layer 116, the touch member 130, the black matrix 140, the color filters 161_R, 161_G, and 161_B, the adhesive layer 150, and the second substrate 102 is well known in this field, so that a description thereof will be omitted in this specification.

Hereinafter, other embodiments will be described. In the following embodiments, a description of the same components as those of the above-described embodiment will be omitted or simplified to avoid redundancy, and differences will be described.

Figure 12:
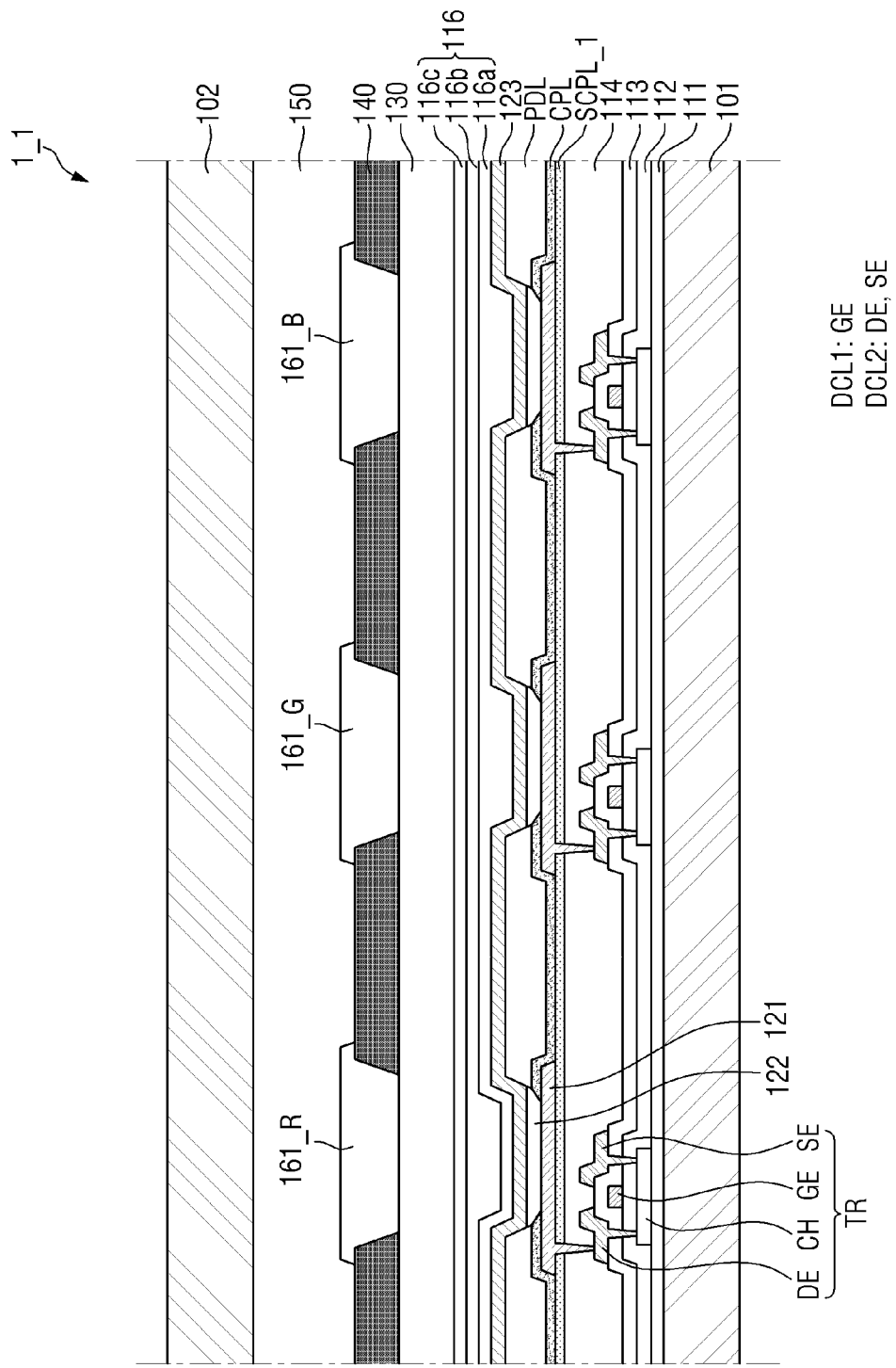
FIG. 12 is a schematic cross-sectional view of a display device according to another embodiment.

FIG. 12 is a schematic cross-sectional view of a display device according to another embodiment.

Referring to FIG. 12, a display device 1_1 according to the embodiment may be different from that of the embodiment of FIG. 4 in that a sub-contact preventing layer SCPL_1 may be further disposed below the first electrode 121.

Specifically, the display device 1_1 according to the embodiment may include the contact preventing layer CPL disposed between the first electrode 121 and the pixel defining layer PDL, and may further include the sub-contact preventing layer SCPL_1 disposed between the first electrode 121 and the planarization layer 114.

The sub-contact preventing layer SCPL_1 may be disposed on the entire planarization layer 114. The sub-contact preventing layer SCPL_1 may contain an inorganic material. The inorganic material may include, e.g., silicon nitride (SiNx), silicon dioxide (SiO2), or the like, or a combination thereof, but is not limited thereto. The sub-contact preventing layer SCPL_1 may contain the same material as that of the contact preventing layer CPL.

The sub-contact preventing layer SCPL_1 may be formed on the entire planarization layer 114 after the formation of the planarization layer 114. In case that the sub-contact preventing layer SCPL_1 may be further formed, the first electrode 121 may be capped by the sub-contact preventing layer SCPL_1 and the contact preventing layer material layer CPLa (see FIG. 7). In other words, the first electrode 121 may be surrounded by the sub-contact preventing layer SCPL_1 and the contact preventing layer material layer CPLa (see FIG. 7). Accordingly, contact between the first electrode 121 and the structure containing the organic material (the planarization layer 114, the pixel defining layer PDL) can be completely prevented.

Due to the presence of the contact preventing layer CPL disposed between the first electrode 121 and the pixel defining layer PDL, the number of dark spots that may occur in the first electrode 121 can be minimized, which makes it possible to improve the reliability of the display device 1_1. Further, by further providing the sub-contact preventing layer SCPL_1, all of the top surface, the side surface, and the bottom surface of the first electrode 121 can be covered by the contact preventing layer CPL and the sub-contact preventing layer SCPL_1. Accordingly, the contact between the first electrode 121 and the planarization layer 114 disposed therebelow can be prevented, and pixel shrinkage can be suppressed or prevented, which makes it possible to improve the reliability of the display device 1_1.

Figure 13:
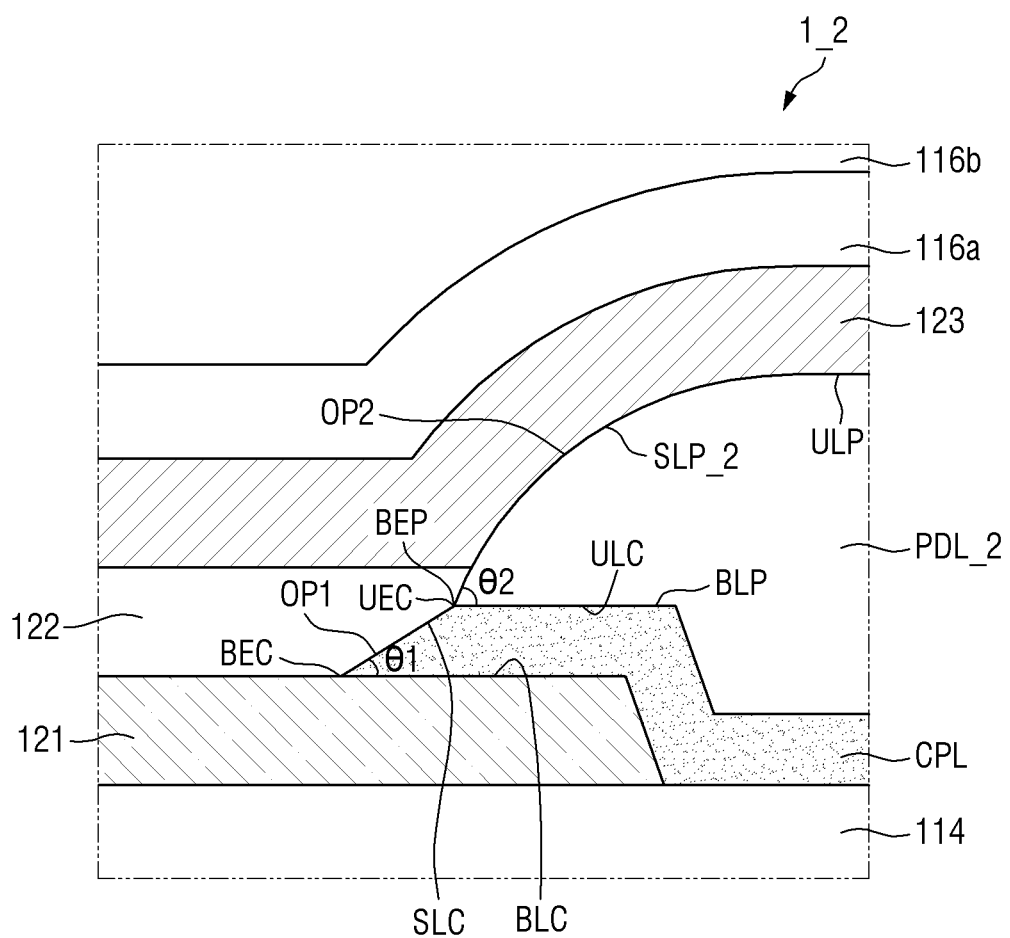
FIG. 13 is an enlarged view showing a part of a schematic cross-sectional view of a display device according to still another embodiment.

FIG. 13 is an enlarged view showing a part of a schematic cross-sectional view of a display device according to still another embodiment.

Referring to FIG. 13, a side surface SLP_2 of a pixel defining layer PDL_2 of a display device 1_2 according to the embodiment may be different from that of the embodiment of FIG. 5 in that at least a part thereof may have a round shape.

Specifically, at least a part of the side surface SLP_2 of the pixel defining layer PDL_2 according to the embodiment may have a round shape. In other words, at least a part of the pixel defining layer PDL_2 may be curved in cross-sectional view.

The lower edge BEP may be disposed at a portion where the side surface SLP_2 of the pixel defining layer PDL_2 and the bottom surface BLP of the pixel defining layer PDL_2 meet, whereas the upper edge UEP (see FIG. 5) may not be disposed at a portion where the side surface SLP_2 of the pixel defining layer PDL_2 and the top surface ULP of the pixel defining layer PDL_2 meet. In other words, the side surface SLP_2 of the pixel defining layer PDL_2 may be curved at the portion where the side surface SLP_2 of the pixel defining layer PDL_2 and the top surface ULP of the pixel defining layer PDL_2 meet. However, without being limited thereto, the upper edge UEP (see FIG. 5) may be disposed at the portion where the side surface SLP_2 of the pixel defining layer PDL_2 and the top surface ULP of the pixel defining layer PDL_2 meet even in case that the side surface SLP_2 of the pixel defining layer PDL_2 may be curved at that portion.

The round portion of the side surface SLP_2 of the pixel defining layer PDL_2 may be formed in the process of patterning the pixel defining layer PDL_2. In the process of exposing the pixel defining layer material layer PDLa (see FIGS. 8 and 9), a part of the light may be incident on a part of the pixel defining layer material layer PDLa (see FIGS. 8 and 9) located in the second region R2 while being reflected or refracted by other components, so that at least a part of the side surface SLP_2 of the pixel defining layer PDL_2 can have a round shape.

Due to the presence of the contact preventing layer CPL disposed between the first electrode 121 and the pixel defining layer PDL_2, the number of dark spots that may occur in the first electrode 121 can be minimized, which makes it possible to improve the reliability of the display device 1_2.

Figure 14:
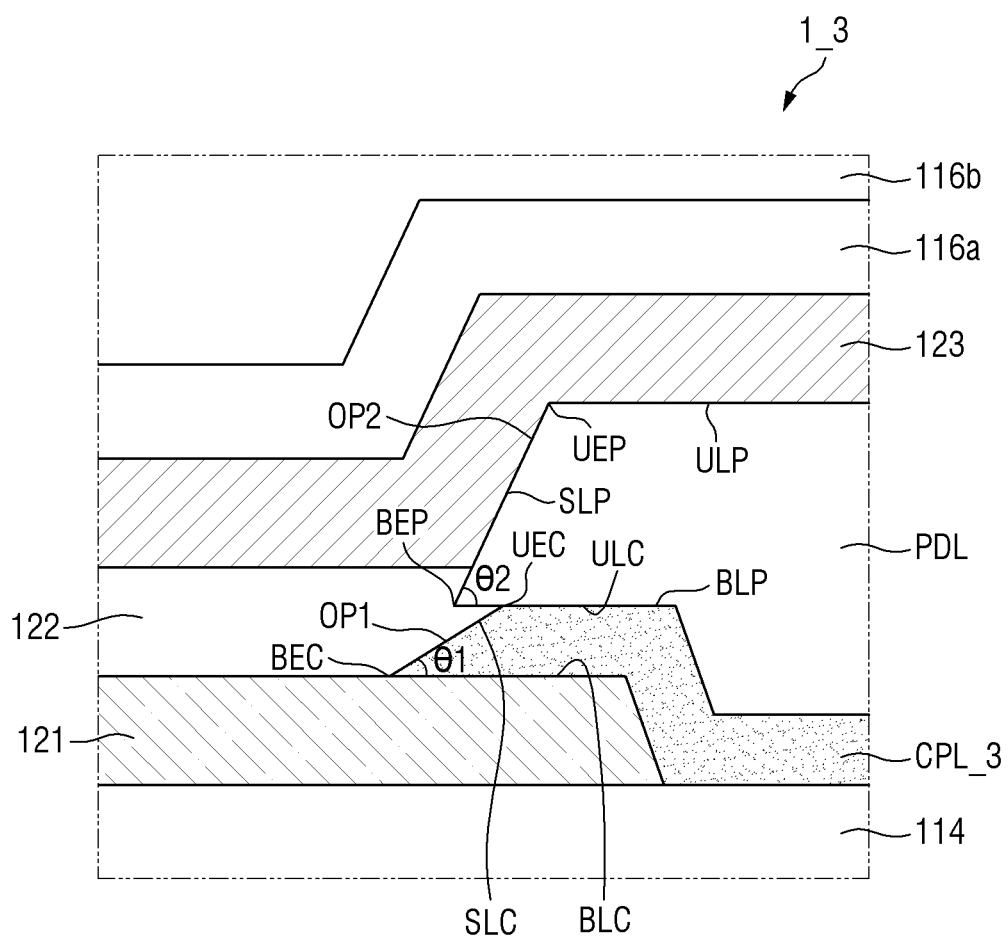
FIG. 14 is an enlarged view showing a part of a schematic cross-sectional view of a display device according to still another embodiment.

FIG. 14 is an enlarged view showing a part of a schematic cross-sectional view of a display device according to still another embodiment.

Referring to FIG. 14, the lower edge BEP of the pixel defining layer PDL of a display device 1_3 according to the embodiment may be different from that of the embodiment shown in FIG. 5 in that it may protrude more outward than the upper edge UEC of the contact preventing layer CPL_3.

Specifically, the upper edge UEC of the contact preventing layer CPL_3 according to the embodiment may be disposed on the bottom surface BLP of the pixel defining layer PDL, and the lower edge BEP of the pixel defining layer PDL may protrude more outward than the upper edge UEC of the contact preventing layer CPL_3. In other words, the upper edge UEC of the contact preventing layer CPL_3 and the lower edge BEP of the pixel defining layer PDL may not coincide with each other.

The lower edge BEP of the pixel defining layer PDL may protrude more outward than the upper edge UEC of the contact preventing layer CPL_3, and the lower edge BEC of the contact preventing layer CPL_3 may protrude more outward than the lower edge BEP of the pixel defining layer PDL. The lower edge BEP of the pixel defining layer PDL may overlap the side surface SLC of the contact preventing layer CPL_3.

Due to the presence of the contact preventing layer CPL_3 disposed between the first electrode 121 and the pixel defining layer PDL, the number of dark spots that may occur in the first electrode 121 can be minimized, which makes it possible to improve the reliability of the display device 1_3.

Figure 15:
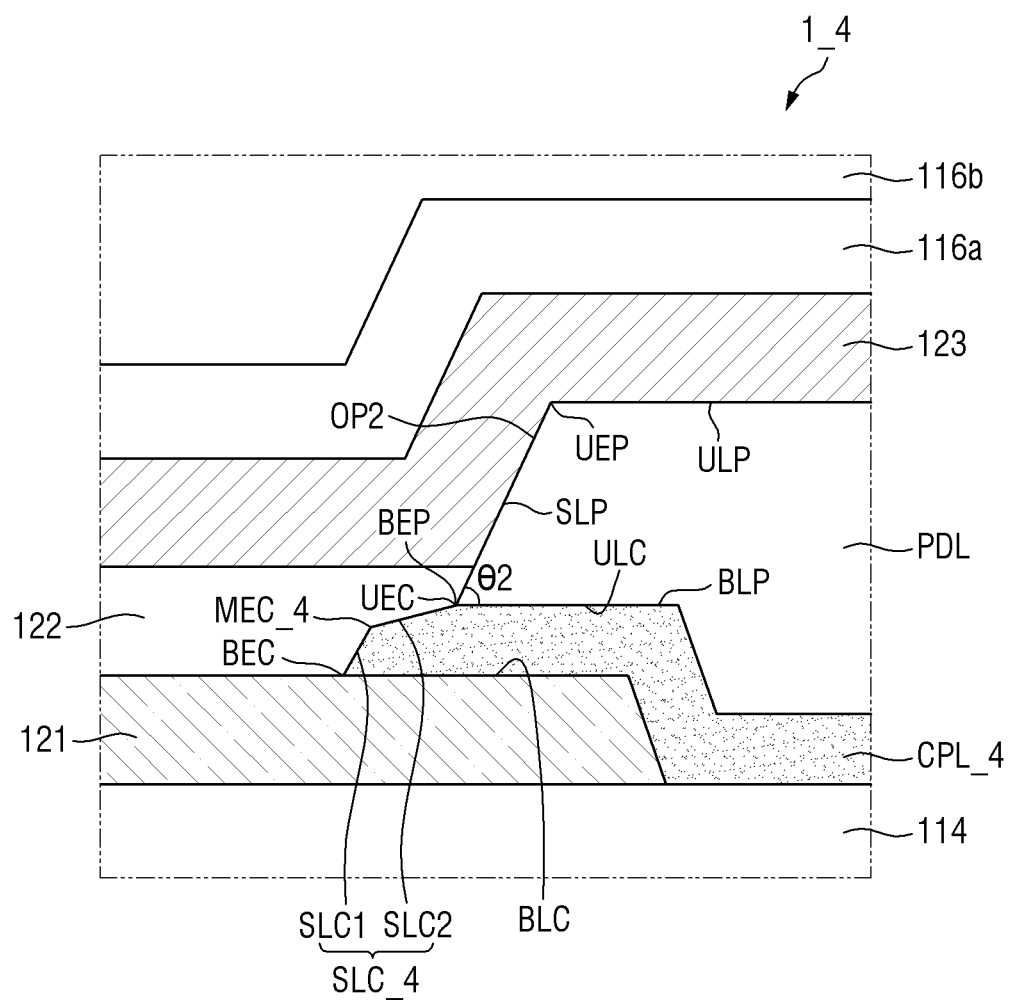
FIG. 15 is an enlarged view showing a part of a schematic cross-sectional view of a display device according to still another embodiment.

FIG. 15 is an enlarged view showing a part of a schematic cross-sectional view of a display device according to still another embodiment.

Referring to FIG. 15, the side surface SLC_4 of the contact preventing layer CPL_4 of a display device 1_4 according to the embodiment may be different from that of the embodiment of FIG. 5 in that the side surface SLC_4 may include regions having different inclinations in cross-sectional view.

Specifically, the side surface SLC_4 of the contact preventing layer CPL_4 according to the embodiment may include two regions SLC1 and SLC2 having different inclinations in cross-sectional view. The side surface SLC_4 of the contact preventing layer CPL_4 may include a first side portion SLC1 and a second side portion SLC2. The first side portion SLC1 may be extended to the bottom surface BLC of the contact preventing layer CPL_4 and the second side portion SLC2, and the second side SLC2 can be extended to the top surface ULC of the contact preventing layer CPL_4 and the first side portion SLC1.

The side surface SLC_4 of the contact preventing layer CPL_4 may include an intermediate edge MEC_4 at portion where the first side portion SLC1 and the second side portion SLC2 meet. The intermediate edge MEC_4 of the contact preventing layer CPL_4 may protrude more outward than the upper edge UEC, and the lower edge BEC may protrude more outward than the intermediate edge MEC_4.

The angle formed by the first side portion SLC1 and the bottom surface BLC of the contact preventing layer CPL_4 may be greater than the angle formed by the extension line of the second side portion SLC2 and the bottom surface BLC of the contact preventing layer CPL_4, but the disclosure is not limited thereto. The angle formed by the extension line of the second side portion SLC2 and the bottom surface BLC of the contact preventing layer CPL_4 may be greater than the angle formed by the first side portion SLC1 and the bottom surface BLC of the contact preventing layer CPL_4.

Although the side surface SLC_4 of the contact preventing layer CPL_4 may include two regions having different inclinations in cross-sectional view, the disclosure is not limited thereto, and the side surface SLC_4 may include three or more regions having different inclinations in cross-sectional view.

Due to the presence of the contact preventing layer CPL_4 disposed between the first electrode 121 and the pixel defining layer PDL, the number of dark spots that may occur in the first electrode 121 can be minimized, which makes it possible to improve the reliability of the display device 1_4.

In concluding the detailed description, those skilled in the art will appreciate that many variations and modifications can be made to the embodiments without substantially departing from the principles of the disclosure. Therefore, the disclosed embodiments of the invention are used in a generic and descriptive sense only and not for purposes of limitation.

What is claimed is:
1. A display device comprising:
    a planarization layer disposed on a substrate;
    a first electrode disposed on the planarization layer and including silver (Ag);
    a contact preventing layer disposed on the first electrode and including a light absorbing material, the contact preventing layer including a top surface and a side surface extending from an end of the top surface; and
    a pixel defining layer disposed on the contact preventing layer, the pixel defining layer including:
        a bottom surface facing the top surface of the contact preventing layer; and
        a side surface extending from an end of the bottom surface, wherein the first electrode includes a first region overlapping the pixel defining layer,
    the contact preventing layer includes a second region overlapping the first region between the first electrode and the pixel defining layer, and
    a first edge where the top surface and the side surface of the contact preventing layer meet is located on the bottom surface of the pixel defining layer.

2. The display device of claim 1, wherein the first edge of the contact preventing layer is in direct contact with a second edge where the bottom surface and the side surface of the pixel defining layer meet.

3. The display device of claim 2, wherein
    the contact preventing layer further includes a bottom surface that is opposite to the top surface of the contact preventing layer, the pixel defining layer further includes a top surface that is opposite to the bottom surface of the pixel defining layer, a third edge where the bottom surface and the side surface of the contact preventing layer meet protrudes more outward than the first edge of the contact preventing layer, and the second edge of the pixel defining layer protrudes more outward than a fourth edge where the top surface and the side surface of the pixel defining layer meet.

4. The display device of claim 3, wherein an angle between the bottom surface and the side surface of the contact preventing layer is smaller than an angle between the bottom surface and the side surface of the pixel defining layer.

5. The display device of claim 2, wherein the side surface of the pixel defining layer includes a round shape.

6. The display device of claim 5, wherein the side surface of the pixel defining layer is curved at a portion where the side surface and the top surface of the pixel defining layer meet.

7. The display device of claim 1, wherein
the contact preventing layer includes an inorganic material, and
the pixel defining layer includes an organic material.

8. The display device of claim 7, further comprising:
a sub-contact preventing layer disposed between the planarization layer and the first electrode, wherein
the planarization layer includes an organic material, and
the sub-contact preventing layer includes an inorganic material.

9. The display device of claim 1, wherein a second edge where the bottom surface and the side surface of the pixel defining layer meet protrudes more outward than the first edge of the contact preventing layer.

10. The display device of claim 1, wherein the contact preventing layer and the pixel defining layer are formed in a same pattern in plan view.

11. The display device of claim 10, wherein
the side surface of the contact preventing layer and the side surface of the pixel defining layer are aligned with each other, and
the entire pixel defining layer overlaps the contact preventing layer.

12. The display device of claim 10, wherein the contact preventing layer has an area greater than an area of the pixel defining layer in plan view.

13. The display device of claim 1, further comprising:
a first opening defined by the contact preventing layer and exposing the first electrode;
a second opening overlapping the first opening and defined by the pixel defining layer;
a light emitting layer disposed on the first electrode exposed by the first opening; and
a second electrode disposed on the light emitting layer, wherein
an inner wall of the first opening coincides with the side surface of the contact preventing layer,
an inner wall of the second opening coincides with the side surface of the pixel defining layer, and
an entire area of the first opening overlaps the second opening.

* * * * *